Figure 1:
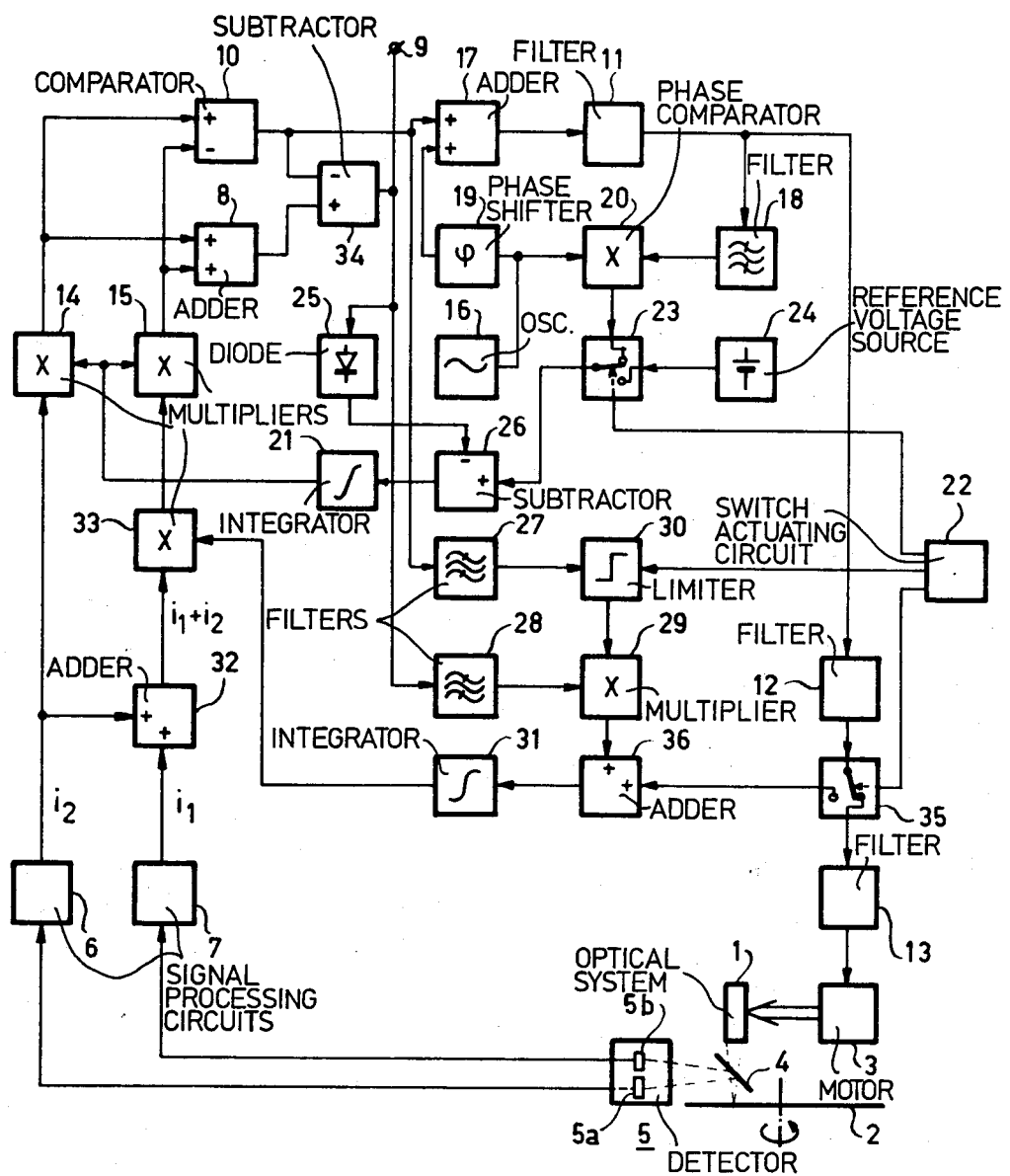

United States Patent [19]

Bierhoff

[11] Patent Number: 4,482,989

[45] Date of Patent: Nov. 13, 1984

[54] APPARATUS FOR OPTICALLY SCANNING A DISC-SHAPED RECORD CARRIER

[75] Inventor: Martinus P. M. Bierhoff, Eindhoven, Netherlands

[73] Assignee: U.S. Philips Corporation, New York, N.Y.

[21] Appl. No.: 350,450

[22] Filed: Feb. 19, 1982

[30] Foreign Application Priority Data

Nov. 26, 1981 [NL] Netherlands ......................... 8105346

[51] Int. Cl.$^3$ .......................... G11B 7/00; G11B 27/00
[52] U.S. Cl. ..................................................... 369/46
[58] Field of Search ..................... 358/342; 369/43, 44, 369/46; 250/201, 202, 204

[56]  References Cited

U.S. PATENT DOCUMENTS 3,932,700  1/1976  Snopko .............................. 369/46 X
4,337,534  6/1982  Basilico et al. ....................... 369/111
4,338,682  7/1982  Hosaka et al. ........................ 369/111

Primary Examiner—Robert L. Richardson
Attorney, Agent, or Firm—Robert T. Mayer; Algy Tamoshunas

[57]  ABSTRACT

An apparatus for optically reading a disc-shaped record carrier, which apparatus comprises a radial tracking control system which employs a radial error signal obtained by comparing two signals supplied by two radially adjacent detectors. In order to stabilize the loop gain of the control loop at a constant value, a measuring signal of predetermined frequency is injected into the control loop. The response of the control loop to said injected signal is compared with the injected signal, which comparison results in a control signal for a controllable amplifier circuit. Suitably, said comparison is a phase comparison. The injected measuring signal causes the scanning beam to oscillate relative to the track to be followed. By measuring the correlation between said oscillation signal and the amplitude of the information signal being read, a signal can be obtained which is a measure of deviations, not caused by tracking errors, between the signals supplied by the two detectors and which may be used for correction purposes.

13 Claims, 6 Drawing Figures

APPARATUS FOR OPTICALLY SCANNING A DISC-SHAPED RECORD CARRIER

The invention relates to an apparatus for optically scanning a disc-shaped record carrier on which information has been recorded in the form of concentric or spiral tracks. Such an apparatus comprises a radiation source for emitting a scanning beam and a read detector for detecting the information contained in the scanning beam after cooperation with the record carrier. The read detector comprises at least two radially adjacent detectors in order to obtain a radial-error signal which is a measure of the radial deviation of the scanning-beam projection from the centre of the track. The apparatus further includes a radial tracking control loop which comprises a circuit for comparing the signals supplied by the two adjacent detectors and generating the radial-error signal and a device for radially moving the scanning-beam projection as a function of said radial-error signal.

Such an apparatus may be employed for reproducing information recorded in analog form (for example video signals) and for reproducing digitally recorded information (for example data storage, digital audio) and is inter alia described in German Patent Application No. 23.42.906. In this respect it is to be noted that, as an alternative to the detection of the read beam by means of a plurality of optical detectors in order to obtain a radial-error signal, it is possible to employ a scanning beam comprising a plurality of sub-beams, for example one main beam and two sub-beams, which are each detected by a separate optical detector, the main beam being used for reading the information and the sub-beams for obtaining a radial-error signal.

A problem associated with the radial tracking control loop in the apparatus mentioned in the opening paragraph is that the magnitude of the signal generated by the read detector greatly depends on the quality of the scanning beam and the geometry of the optically detectable pits on the disc. Also of influence are the reflection and transmission efficiency of the disc and the optical system for projecting the radiation beam and the amount of radiation emitted by the radiation source. In addition, depending on the manner in which the read detector is moved over the disc in the radial direction, the angle between the line separating the two optical detectors and the track may vary. These factors result in a variation of the loop gain in the control loop by approximately a factor 5.5, which manifests itself as a variation by a factor of approximately 2.3 in the bandwidth of the control loop.

It is an object of the invention to provide an apparatus of the type mentioned in the opening paragraph having an improved constancy of the loop gain in said control loop. To this end the invention is characterized by a controllable amplifier circuit arranged in said control loop, for controlling the loop gain in said control loop, an oscillator circuit, for applying a signal of predetermined frequency to said control loop, a detection circuit, for detecting the response of said control loop to the applied signal, and a control circuit for controlling the controllable amplifier circuit as a function of said detected response so as to maintain the loop gain within said control loop at a substantially constant value.

Said detection circuit may be an amplitude detector. With respect to the detection circuit a preferred embodiment of the apparatus in accordance with the invention is further characterized in that the detection circuit comprises a phase detector for comparing the phase of the signal generated by the oscillator circuit with the phase of the response at a predetermined point in said control loop, and in that the control circuit controls the controllable amplifier circuit to provide a gain such that said phase difference, detected by the phase detector, is maintained at a predetermined value.

Since the phase difference is related to the loop gain in the control loop, the loop gain is thus maintained at a constant value. One advantage of this arrangement is that phase detection at one specific frequency is comparatively simple. The preferred embodiment may further be characterized in that the phase detector is adapted to measure a phase difference of about 90°. The advantage of this is that the phase detector can then be of very simple design.

Since the phase difference may deviate from 90°, for example in view of the linearity of the control characteristic, it may be advantageous to include a phase shifter in such a way that when the phase detector measures a phase difference of 90° the phase shift of the response of the control loop to the signal generated by the oscillator circuit has a predetermined value which differs from 90°. As a result of this it is still possible to employ 90° phase detection.

During radial tracking control in the apparatus in accordance with the invention certain asymmetries may give rise to deviations between the signals supplied by the two optical detectors which are not caused by tracking errors, as a result of which the radial tracking control loop drives the scanning beam off the centre of the track to be followed. In accordancd with a further characteristic feature of the invention this problem can be solved by a correlation detection circuit, for supplying a signal which is a measure of the correlation between the amplitude of the information signal read by the read detector and the radial tracking error, and a balancing amplifier-circuit for balancing the signals supplied by the two optical detectors relative to each other as a function of the signal supplied by the correlation detection circuit. This aspect of the apparatus in accordance with the invention is based on the insight that the measuring signal applied for stabilizing the loop gain in the radial tracking control loop causes the scanning beam to oscillate relative to the track, which enables the signal for correcting said asymmetries to be obtained. This last-mentioned embodiment may further be characterized in that the balancing amplifier-circuit comprises a first and a second input and a first and a second output, the two optical detectors each being coupled to one of the two inputs, the first input being coupled to the first output, the first and the second input being connected to an adder circuit, which is connected to the second output via a controllable amplifier circuit having a gain factor which is variable around 0.5.

The output signal of the correlation detection circuit ensures that the balancing amplifier-circuit controls said correlation towards a minimum value. This control point is not influenced by the loop gain control. Conversely, the balancing amplifier circuit hardly affects the amplitude of the a.c. component in the radial tracking error signal (but it does influence the d.c. component in this radial tracking signal), so that the balancing amplifier-circuit has little, if any, affect on the loop-gain control. Thus, the two control systems do not interfere with each other, which improves the stability during, for example, starting phases. Moreover, the bandwidths of the two control systems may now overlap each other.

Figure 2:
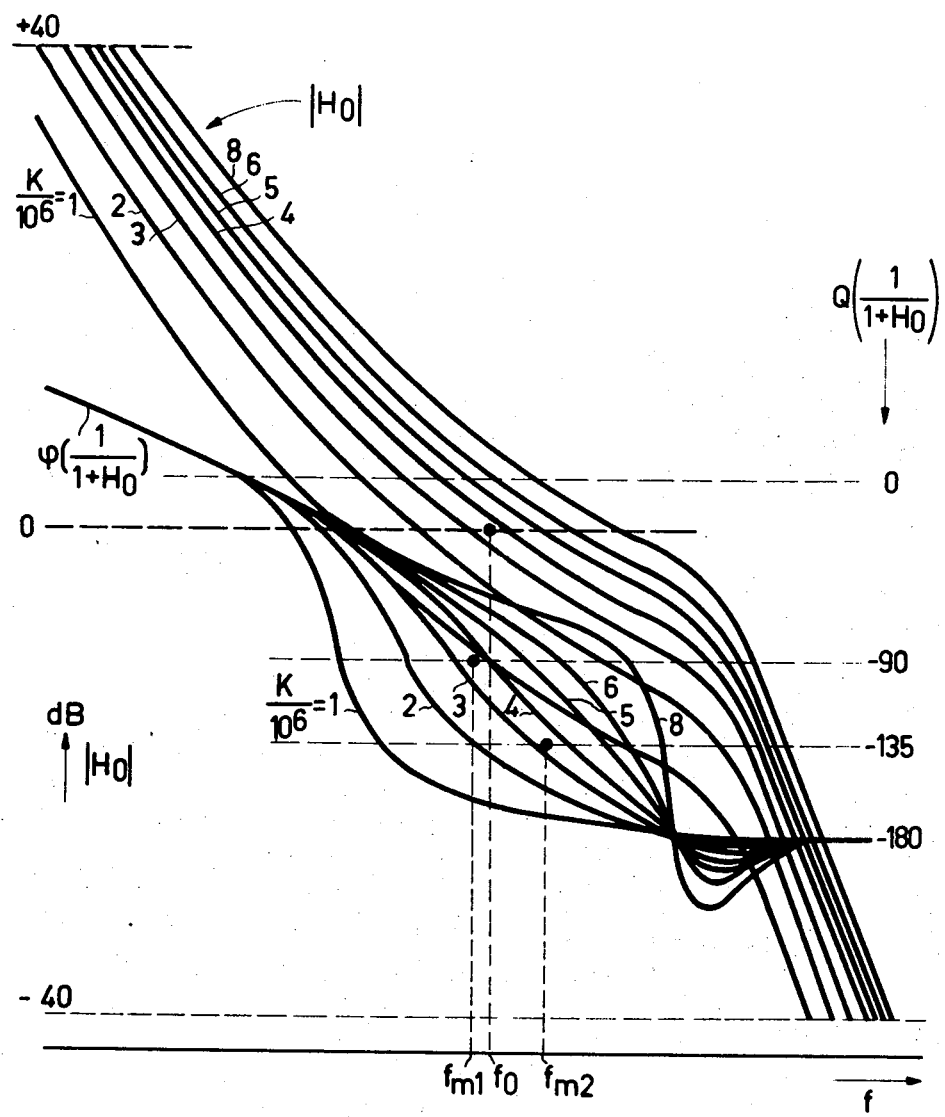
Figure 3:
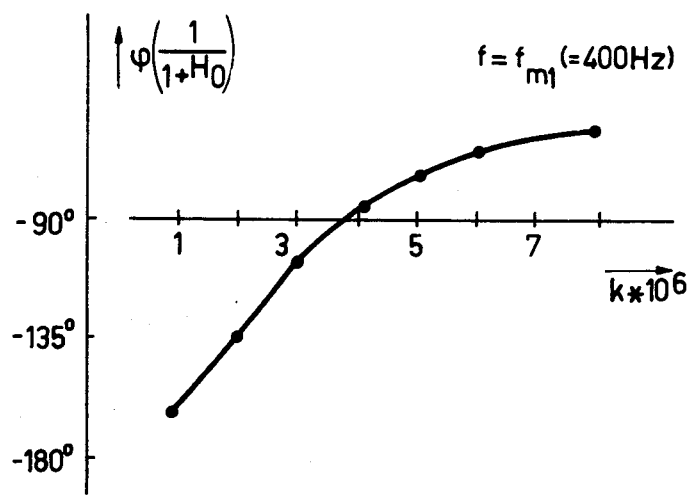
Figure 4:
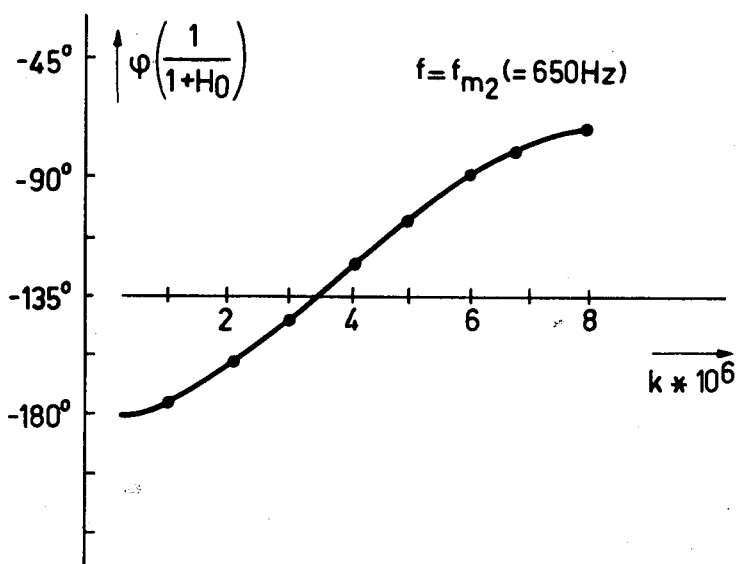
Figure 5:
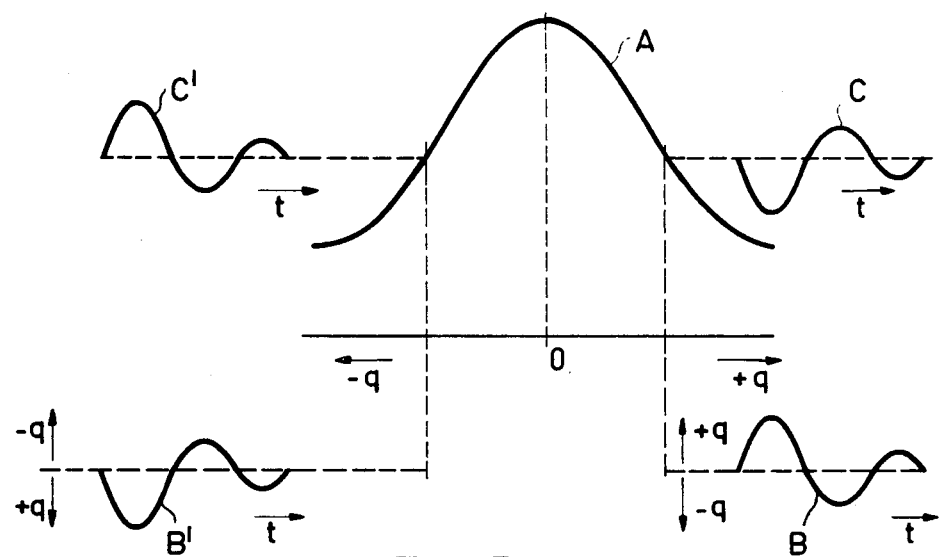
Figure 6:
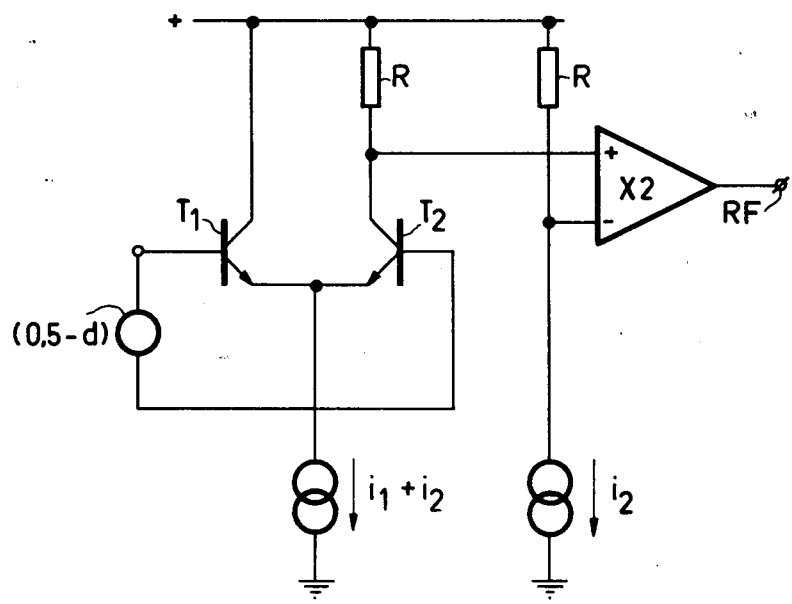

The invention will now be described in more detail with reference to the drawing. In the drawing:

FIG. 1 shows a preferred embodiment of the apparatus in accordance with the invention, FIG. 2 is a diagram to explain the choice of the frequency of the measuring signal generated by the oscillator 19, FIG. 3 is a diagram to clarify the diagram of FIG. 2, FIG. 4 is a diagram similar to that of FIG. 3 for a different frequency of the measuring signal, FIG. 5 is a diagram to illustrate the operation of the apparatus of FIG. 1 as regards the generation of a control signal for the correction of asymmetries, and FIG. 6 shows the multiplier 33 in the apparatus as shown in FIG. 1 in more detail.

FIG. 1 shows a preferred embodiment of an apparatus for optically scanning a record carrier in accordance with the invention. The operation of this apparatus is described with reference to FIGS. 2 to 5, which represent diagrams in explanation of the operation of the apparatus.

The apparatus comprises an optical system 1 for projecting a scanning beam onto a rotating disc 2. The optical system 1 is radially movable (relative to the disc 2) by means of a transducer 3, for example a motor. In the present example the information on the disc is read in that the scanning beam is reflected from the disc 2 and via a semi-transparent mirror 4 is projected onto a read detector 5. The read detector 5 comprises two optical detectors 5a and 5b, which are situated on both sides of the centre of the track scanned on the disc 2 when viewed in the radial direction via the mirror 4. The signals supplied by the two detectors 5a and 5b are initially processed in circuits 6 and 7, for example preamplified and filtered, and after a number of further operations to be described hereinafter they are adder in the added circuit 8 and the sum signal is available on an output 9 for further processing of the information signal contained in said sum signal. The signals supplied by the two optical detectors 5a and 5b are also applied to a circuit 10, which determines the difference between the signals supplied by said detectors. The difference is a measure of the extent to which the scanning beam is centred on the track to be scanned on the disc 2. For radial tracking the difference signal is applied to the transducer 3 after a number of operations to be described hereinafter and some filtrations by means of filters 11 (reduction of the signal at low frequencies corresponding to the speed of the disc 2), 12 (reduction at high frequencies to prevent instabilities), and 13 (low pass-filter for inter alia noise suppression).

The magnitude of the signal obtained by means of the detectors 5a and 5b depends on a large number of parameters, inter alia the quality of the light spot on the disc, the geometry of the information pits on the disc, the reflection and transmission efficiency of the disc 2 and the optical system 1, and the amount of light produced by the laser in the optical system. In the case of an optical system which does not move in accordance with a perfectly radial line the angle between the line separating the two detectors 5a and 5b and the track on the disc may vary. As a result of all these factors the loop gain in the described control loop may vary by a factor of 5.5, which causes a variation in the bandwidth of the control system by approximately a factor of 2.3. In order to cancel the effects of this variation gain control is applied. Gain control is effected by means of amultipliers or variable amplifiers 14 and 15 which amplify the signals supplied by the detectors 5a and 5b by a factor k. A control signal for said multipliers 14 and 15 is generated in that a measuring signal obtained from an oscillator 16 is injected into the control loop via the adder circuit 17. The response of the control loop to the measuring signal becomes available via a band-pass filter 18 and comparison with the injected measuring signal yields a signal for controlling the multipliers 14 and 15. The comparison may be an amplitude comparison, but in the present example it is a phase comparison. Indeed, the phase difference between the injected measuring signal and the extracted measuring signal is related to the loop gain. The phase measurement has been selected because a phase measurement at one specific frequency is comparatively simple. The operation of this loop-gain measurement is explained with reference of FIG. 2. Said Figure shows a first family of characteristics representing the amplitude $|H_o|$ of the open-loop gain $H_o$ of the control loop for various values of k (the gain of the multipliers 14 and 15) as a function of the frequency f, and a family of characteristics representing the phase $\phi$ of the response $1/(1+H_o)$ of the control loop to injection of the measuring signal as a function of the frequency for various values of the parameter k.

If a specific bandwidth $f_o$ (for example 500 Hz) is desired the required value of $|H_o|$ and consequently of k is found in the family $|H_o|$ for $|H_o|=1$. In this family this is obtained for $k=3.5\times10^6$. If gain control around $\phi=-90°$ is adopted (detection around a phase difference of $\pm 90°$ is comparatively simple) the frequency $f_m$ (for example 400 Hz) for $\phi$ at $\phi=-90°$ and $k=3.5\times10^6$.

FIG. 3 represents the phase $\phi$ as a function of the factor k for $f=f_{m1}$ (=400 Hz). Said characteristic is then the control characteristic around $\phi=-90°$ and for a measuring signal of the frequency $f_{m1}$. It is found that this characteristic is comparatively flat for $\phi>-90°$, which is less desirable. However, if a frequency $f_{m2}$ (for example 600 Hz) is selected for which $\phi=-135°$ at $k=3.5\times10^6$ (see FIG. 2), the control characteristic will be as shown in FIG. 4. This characteristic is more linear than that shown in FIG. 3, whilst in a practical embodiment it was found that the amplitude of the response $1/(1+H_o)$ for $f_{m1}=600$ Hz was maximum. If nevertheless a phase measurement around $-90°$ is required, a 45° phase-shifting network 19 may be used, which in the embodiment shown in FIG. 1 is arranged between the oscillator 16 and the adder circuit 17. The actual phase measurement is then effected by means of a multiplier 20, which in its simplest form may comprise two limiter circuits which convert the signals on the inputs into square-wave signals, an exclusive-OR gate. Such a phase comparator supplies a square-wave signal having a duty cycle which is a measure of the phase difference. Said duty-cycle is 50% for $\phi=\pm90°$. Said square-wave signal is integrated by means of an integrator 21, whose output signal controls the multipliers 14 and 15. Thus the gain in the control loop is controlled in such a way that the phase difference between the oscillator signal and the signal extracted by the band-pass filter 18 is equal to $-90°$ or, in accordance with the diagrams of FIG. 2, in such a way that the factor k is equal to $3.5\times10^6$ and the bandwidth of the control loop is equal to $f_o$. As an alternative, the phase-shifting network 19 may be replaced by a phase-shifting network in, for example, the measuring loop before or after the filter 18.

The tracking system described in the foregoing functions only when a track on the disc 2 is followed. When the system is started or, for example, during special scanning modes, such as those during which a track change takes place, the radial tracking-error signal will not have its nominal value. This may give rise to problems with respect to locking-in of the control system. In order to preclude these problems the integrator input, when the control system is not used, is connected to a source 24 of a reference voltage $V_{ref}$ via a switch 23 actuated by a circuit 22, instead of to the phase comparator 20. As a result of this, the integrator 21 is charged to the voltage $V_{ref}$, which results in an increased amplitude of the radial error signal in the control loop. The output of the comparator 10 is connected to the integrator 21 via a diode 25 and the subtractor circuit 26. As a result of this, the integrator discharges when the radial error signal on the output of the comparator 10 exceeds the reference voltage by one diode voltage $V_d$ and the increase of the radial error signal is limited at a peak-to-peak value of approximately 2 $V_{ref}$ so that a radial error signal with a well-defined amplitude is available when the radial control loop is inoperative.

The radial error signal is obtained by subtracting the signals supplied by the two optical detectors from each other. However, owing to asymmetries, such as an asymmetrical scanning beam, a scanning beam which is not incident perpendicularly to the disc 2, unequal sensitivities of the two optical detectors 5a and 5b etc., the radial error signal will not be equal to zero when the scanning beam is exactly centred on the track. As a result of this, the control loop attempts to eliminate said error signal by moving the scanning beam off the centre of the track.

An additional error signal is therefore required in order to preclude such faults as a result of asymmetries. A method of obtaining such an error signal is explained with reference to FIG. 5. In this Figure the curve A represents the amount of light received from the disc, i.e. the sum signal on the output 9 as a function of the location q of the scanning beam relative to the centre of the track (q=0), which curve is the envelope of the radiation beam which has been high-frequency modulated by the information structure. Curve B represents a deviation of the point of incidence (q) of the radiation beam as a function of time (t) towards one side of the track centre (q=0) and curve B' represents such a deviations of the point of incidence towards the other side of the track centre. Curves B and B' each correspond to a radial error signal. Curve C and curve C' respectively represent the associated variation of the amplitude of the high-frequency sum signal. FIG. 5 shows that a beam deviation towards the one side (+q) produces a variation of said amplitude which is in phase with the radial error signal and a deviation towards the other side (−q) gives rise to a variation which is in phase opposition to the radial error signal.

A signal which provides an indication of the point of incidence of the beam can thus be obtained by measuring the correlation between the radial error signal and the amplitude of the sum signal. By integrating the result of said correlation measurement (for example synchronous detection) a control signal is obtained which by acting on the radial control loop, can preclude said errors as a result of asymmetries.

A varying deviation of the scanning beam will always exist, for example as a result of noise or irregularities in the track. However, in combination with the radial control system already described such a deviation is always accurately defined. Indeed, said measuring signal of the frequency $f_m$ represents a periodic deviation of the radiation beam. By means of the deviation as a result of an applied signal a substantially higher bandwidth can be achieved than when the first-mentioned deviation is utilized. By means of bandpass filters centred around said frequency $f_m$ a signal corresponding to said specific deviation and the result of said deviation in the sum signal can then be derived from the radial error signal. In the embodiment shown in FIG. 1 this is effected by means of filters 27 and 28. Synchronous detection is then effected by means of a multiplier 29. Since in the case of a closed control loop the phase of the variation of the sum signal relative to the phase of the deviation constitutes sufficient information, the filtered-out component of the radial error signal is limited by means of a limiter circuit 30. The multiplier 29 may then be comparatively simple, because it only needs to transfer the output signal of the filter 28 as a function of the phase of the output signal of the filter 27, that is to say with a polarity inversion which alternates with half the period of the output signal of the filter 27. The output signal of the synchronous detector 29 is integrated by means of an integrator 31 and yields a control signal for the radial control loop. Compensation with this control signal is possible by subtracting this signal, which is a measure of the offset in the radial control loop, from the radial error signal. However, this may give rise to problems: in the event of a drop-out in the reflected signal the signals generated by the two detectors 5a and 5b are zero and the radial error signal is also zero. As a result of the integration when generating the error signal for said asymmetry correction, this error signal will exhibit no drop-out and will appear in the radial error signal as a spurious pulse. A compensation method which does not have this drawback is obtained by balancing the signals from the two optical detectors 5a and 5b. If these signals are $i_1$ and $i_2$ respectively, the radial error signal RF will be:

$$RF = i_1 - i_2$$

A balance correction by a factor $(1+E)$ yields:

$$RF = \frac{1}{(1+E)} i_1 - (1+E) i_2$$

For $E \ll 1$ this may be simplified to:

$$RF = (1-E)i_1 - (1+E)i_2$$

This correction can be effected by means of two multipliers. An even simpler correction is obtained as follows: When $2d = 1 - E$ it follows that:

$$RF = 2di_1 - (2-2d)i_2, \text{ or}$$

$$\tfrac{1}{2}RF = d(i_1 + i_2) - i_2$$

This correction is possible by means of one multiplier which multiplies by a factor $d \approx \tfrac{1}{2}$. The multiplier may then simply comprise a differential pair of transistors $T_1$ and $T_2$, as is shown in FIG. 6. The signal $i_1 + i_2$ is applied to the emitters as a current, a signal $(0.5 - d)$ is applied between the two base electrodes, and by means of a differential amplifier the signal $i_2$ is subtracted from the collector signal of transistor $T_2$.

In the embodiment shown in FIG. 1 the foregoing is achieved as follows: by means of an adder circuit 32 the signals from the two optical detectors 5a and 5 are added ($i_1+i_2$). This sum signal is multiplied by the factor d by means of a multiplier 33 which is controlled by an integrator 31. In the comparator circuit 10 the difference $i_2-d(i_1+i_2)$, which is the radial error signal, is formed.

As a result of the processing by the adder circuit 32 the adder circuit 8 no longer supplies the sum signal $k(i_1+i_2)$. This is corrected by subtracting the radial error, available on the output of the comparator circuit 10, from the output signal of the adder circuit 8 by means of a subtractor circuit 34. The asymmetry correction described in the foregoing only functions correctly when the radial servo control is inoperative, which means that it will not function during, for example, starting or track changes. In those cases the radial error signal for the actuator 3 is added to the output signal of the multiplier 29 by means of the adder circuit 36 with the aid of the switch 35, which is actuated by the circuit 22. Circuit 22 then sets the limiter circuit 30 to a position in which the multiplier 29 no longer changes the polarity of the output signal of the filter 28, so that the multiplier 29 supplies a signal which is exempt from d.c., which signal is eliminated in the integrator 31. As a result of this, the multiplier 33 is controlled in such a way that the radial error signal is exempt from d.c.

The balancing amplifier 33 together with the adder circuit 32 may alternatively be arranged after the amplifier circuits 14 and 15. The amplifier circuits 14 and 15 may alternatively be replaced by one amplifier circuit in the common part of the radial tracking control loop, for example after the subtractor circuit 10.

What is claimed is:

1. An apparatus for optically scanning a record carrier having information recorded thereon in elongated tracks, said apparatus comprising means for projecting a radiation beam onto said record carrier so as to scan said tracks upon relative movement between said beam and said record carrier, first means for deriving information contained in a track being scanned from radiation of said beam coming from the record carrier, said first deriving means producing an information signal representative of the information contained in said track being scanned, second means for deriving from said radiation of said beam coming from the record carrier a tracking error signal representative of the deviation of said beam from the center of the track being scanned in a direction transverse to the track direction, and means responsive to said tracking error signal for moving said beam in said transverse direction so as to maintain said beam centered on said track being scanned, said second deriving means comprising a tracking control loop including at least two adjacent detectors disposed in the path of said said radiation coming from said record carrier and each supplying an output signal, means for comparing said output signal supplied by said detectors and generating said tracking error signal, variable amplifier means arranged in said control loop for controlling the loop gain, means for applying a measuring signal of predetermined frequency to said control loop, means for detecting the response of said control loop to said measuring signal and means for controlling said variable amplifier means in dependence on the response of said loop detected by said detecting means so as to maintain the loop gain at a substantially constant value.

2. The apparatus according to claim 1 wherein said detecting means detects the difference in the phase of said measuring signal and the phase of said response of said control loop to said measuring signal and wherein said control means controls said variable amplifier means so that the loop gain is such as to maintain said phase difference at a predetermined value.

3. The apparatus according to claim 2 wherein said detecting means is adapted to detect a phase difference of about 90°.

4. The apparatus according to claim 3 including means for shifting the phase of one of said measuring signal and said loop response by an amount such that said phase shift in combination with said predetermined phase difference results in detection of a phase difference of about 90° by said detecting means.

5. The apparatus according to claims 1, 2, 3 or 4 including means for balancing said output signals supplied by said two detectors so as to reduce tracking error due to system asymmetries.

6. The apparatus according to claim 5 wherein said balancing means includes second means for comparing said information signal and said tracking error signal and means for varying the amplitude of at least one of said output signals in response to said comparing means.

7. The apparatus according to claim 6 wherein said amplitude varying means includes a balancing amplifier coupled between at least one of said detectors and said second comparing means.

8. An apparatus for optically scanning a record carrier having information recorded thereon in elongated tracks, said apparatus comprising means for projecting a radiation beam onto said record carrier so as to scan said tracks upon relative movement between said beam and said record carrier, first means for deriving from radiation of said beam coming from the record carrier an information signal representative of the information contained in a track being scanned, second means for deriving from said radiation of said beam coming from the record carrier a tracking error signal representative of the deviation of said beam from the center of the track being scanned in a direction transverse to the track direction, and means responsive to said tracking error signal for moving said beam in said transverse direction so as to maintain said beam centered on said track being scanned, said second deriving means including at least two adjacent detectors disposed in the path of said radiation coming from said record carrier and each supplying an output signal, first means for comparing said output signals and generating a difference signal indicative of the difference between said output signals, said difference signal being representative of said deviation of said beam, and means for coupling said difference signal to said beam moving means to thereby define a tracking control loop, means for applying to said control loop a measuring signal of a predetermined frequency so as to produce a corresponding oscillation of said beam relative to the track being scanned thereby producing a corresponding variation in said difference signal, second means for comparing said measuring signal and said difference signal, said second comparing means producing a further signal indicative of the response of said control loop to said measuring signal, and means for varying the gain of said control loop in response to said further signal so as to maintain the loop gain of said control loop at a substantially constant value.

9. The apparatus according to claim 8 wherein said gain varying means includes means for amplifying at least one of said output signals by an amount which is dependent on said further signal.

10. The apparatus according to claim 9 wherein said amplifying means includes a variable amplifier coupled between each of said detectors and said first comparing means.

11. The apparatus according to claim 8, 9 or 10, wherein said second comparing means includes means for comparing the phase of said difference signal and the phase of said measuring signal, said further signal being representative of the difference in the phase of said measuring and difference signals, and wherein the gain of said control loop is adjusted in response to said further signal so as to maintain said phase difference at a predetermined value.

12. The apparatus according to claim 8 wherein said measuring signal applying means include an oscillator for generating said measuring signal and means for adding said measuring signal to said difference signal.

13. The apparatus according to claim 8 wherein said record carrier is a disc and said tracks are circular and extend about the center of said disc.

* * * * *